(12) United States Patent
Wang et al.

(10) Patent No.: US 12,040,505 B2
(45) Date of Patent: Jul. 16, 2024

(54) METHOD FOR MANUFACTURING AN INTERFACIAL LITHIUM FLUORIDE LAYER FOR AN ELECTROCHEMICAL CELL

(71) Applicant: GM GLOBAL TECHNOLOGY OPERATIONS LLC, Detroit, MI (US)

(72) Inventors: Biqiong Wang, Madison Heights, MI (US); Meinan He, Birmingham, MI (US); Mei Cai, Bloomfield Hills, MI (US); Andrew J. Galant, Shelby Township, MI (US); William Osad, Macomb, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 78 days.

(21) Appl. No.: 17/880,521

(22) Filed: Aug. 3, 2022

(65) Prior Publication Data

US 2024/0047821 A1 Feb. 8, 2024

(51) Int. Cl.

| | |
|---|---|
| *H01M 4/04* | (2006.01) |
| *C23C 16/30* | (2006.01) |
| *C23C 16/455* | (2006.01) |
| *H01M 4/139* | (2010.01) |
| *H01M 4/36* | (2006.01) |

(Continued)

(52) U.S. Cl.
CPC ........... *H01M 50/414* (2021.01); *C23C 16/30* (2013.01); *C23C 16/45553* (2013.01); *H01M 4/139* (2013.01); *H01M 4/366* (2013.01); *H01M 4/382* (2013.01); *H01M 4/62* (2013.01);

(Continued)

(58) Field of Classification Search
CPC ................................ H01M 4/04; H01M 10/00
See application file for complete search history.

(56) References Cited

U.S. PATENT DOCUMENTS

| 8,974,946 B2 | 3/2015 | Cai et al. |
|---|---|---|
| 9,123,939 B2 | 9/2015 | Xiao et al. |

(Continued)

FOREIGN PATENT DOCUMENTS

| CN | 117525537 A | 2/2024 |
|---|---|---|
| DE | 102023101040 A1 | 2/2024 |

(Continued)

OTHER PUBLICATIONS

Hornsveld et al. "Atomic layer deposition of LiF using LiN(SiMe3)2 and SF6 plasma" (2021).*

(Continued)

*Primary Examiner* — Austin Murata
(74) *Attorney, Agent, or Firm* — Harness, Dickey & Pierce, P.L.C.

(57) ABSTRACT

A method for manufacturing an interfacial lithium fluoride layer for an electrochemical cell that cycles lithium ions is disclosed. In the method, a substrate is positioned in a reaction chamber of an atomic layer deposition reactor and a lithium fluoride (LiF) precursor is introduced into the reaction chamber such that the LiF precursor contacts and chemically reacts with functional groups on the substrate. Then, an oxidant is introduced into the reaction chamber to form a single molecular layer of lithium fluoride on the substrate. The lithium fluoride layer is formed on the substrate at a temperature of greater than or equal to about 110 degrees Celsius to less than or equal to about 250 degrees Celsius.

18 Claims, 2 Drawing Sheets

(51) Int. Cl.
*H01M 4/38* (2006.01)
*H01M 4/62* (2006.01)
*H01M 50/403* (2021.01)
*H01M 50/414* (2021.01)
*H01M 50/431* (2021.01)
*H01M 50/449* (2021.01)
*H01M 50/46* (2021.01)

(52) U.S. Cl.
CPC ....... *H01M 50/403* (2021.01); *H01M 50/431* (2021.01); *H01M 50/449* (2021.01); *H01M 50/46* (2021.01)

(56) References Cited

U.S. PATENT DOCUMENTS

| | | | |
|---|---|---|---|
| 9,160,036 B2 | 10/2015 | Yang et al. | |
| 9,252,411 B2 | 2/2016 | Abd Elhamid et al. | |
| 9,302,914 B2 | 4/2016 | Liu et al. | |
| 9,362,552 B2 | 6/2016 | Sohn et al. | |
| 9,373,829 B2 | 6/2016 | Xiao et al. | |
| 9,437,871 B2 | 9/2016 | Zhou et al. | |
| 9,537,144 B2 | 1/2017 | Huang et al. | |
| 9,647,254 B2 | 5/2017 | Dadheech et al. | |
| 9,742,028 B2 | 8/2017 | Zhou et al. | |
| 9,896,763 B2 | 2/2018 | Dadheech et al. | |
| 9,905,847 B2 | 2/2018 | Dadheech et al. | |
| 9,923,189 B2 | 3/2018 | Xiao | |
| 9,929,435 B2 | 3/2018 | Cai et al. | |
| 9,979,008 B2 | 5/2018 | Dai et al. | |
| 9,985,284 B2 | 5/2018 | Dadheech et al. | |
| 10,084,204 B2 | 9/2018 | Dai et al. | |
| 10,128,481 B2 | 11/2018 | Xiao et al. | |
| 10,141,559 B2 | 11/2018 | Xiao et al. | |
| 10,199,643 B2 | 2/2019 | Zhou et al. | |
| 10,312,501 B2 | 6/2019 | Yang et al. | |
| 10,326,166 B2 | 6/2019 | Yang et al. | |
| 10,367,201 B2 | 7/2019 | Yang et al. | |
| 10,381,170 B2 | 8/2019 | Dai et al. | |
| 10,396,360 B2 | 8/2019 | Xiao et al. | |
| 10,431,849 B2 | 10/2019 | Yersak et al. | |
| 10,573,879 B2 | 2/2020 | Yang et al. | |
| 10,622,627 B2 | 4/2020 | Dadheech et al. | |
| 10,629,941 B2 | 4/2020 | Dai et al. | |
| 10,629,949 B2 | 4/2020 | Yersak et al. | |
| 10,680,281 B2 | 6/2020 | Yersak et al. | |
| 10,734,673 B2 | 8/2020 | Yersak et al. | |
| 11,094,996 B2 | 8/2021 | Xiao et al. | |
| 11,101,501 B2 | 8/2021 | Liu et al. | |
| 11,239,459 B2 | 2/2022 | Yersak et al. | |
| 11,328,878 B2 | 5/2022 | Dai et al. | |
| 2014/0106070 A1* | 4/2014 | Mantymaki | C23C 16/30 427/255.39 |
| 2015/0056387 A1 | 2/2015 | Dadheech et al. | |
| 2015/0056493 A1 | 2/2015 | Dadheech et al. | |
| 2015/0056507 A1 | 2/2015 | Dadheech et al. | |
| 2015/0180023 A1* | 6/2015 | Xiao | H01M 4/0423 429/231.8 |
| 2015/0349307 A1 | 12/2015 | Dadheech et al. | |
| 2016/0172706 A1 | 6/2016 | Xiao et al. | |
| 2017/0271678 A1 | 9/2017 | Yang et al. | |
| 2019/0372155 A1 | 12/2019 | Yersak et al. | |
| 2020/0395630 A1 | 12/2020 | Yersak et al. | |

FOREIGN PATENT DOCUMENTS

| | | |
|---|---|---|
| WO | WO-2014182281 A1 | 11/2014 |
| WO | WO-2017045573 A1 | 3/2017 |

OTHER PUBLICATIONS

Xingwen Yu et al.; "Electrode-Electrolyte Interfaces in Lithium-based Batteries"; Royal Society of Chemistry; Energy and Environmental Science; vol. 11; Issue 3; Jan. 9, 2018; 16 pages.

Jie Zhao et al.; "Surface Fluorination of Reactive Battery Anode Materials for Enhanced Stability"; Journal of the American Chemical Society; Jul. 2017; 10 pages.

Milad Madadi et al.; "Atomic and Molecular Layer Deposition of Alkali Metal Based Thin Films"; ACS Applied Materials and Interfaces 2021, 13; pp. 56793-56811.

Lan Zhang et al.; "LiF as an Artificial SEI Layer to Enhance the High-Temperature Cycle Performance of Li4Ti5O12"; Langmuir; Aug. 2017, 33; pp. 11164-11169.

* cited by examiner

METHOD FOR MANUFACTURING AN INTERFACIAL LITHIUM FLUORIDE LAYER FOR AN ELECTROCHEMICAL CELL

INTRODUCTION

This section provides background information related to the present disclosure which is not necessarily prior art.

The present disclosure generally relates to methods of manufacturing lithium fluoride layers via atomic layer deposition processes and, more particularly, to methods of manufacturing interfacial lithium fluoride layers on one or more components of an electrochemical cell prior to assembly of the electrochemical cell.

Lithium fluoride (LiF) is a desirable material for use along an interface between a negative electrode layer and a porous separator of an electrochemical cell due to lithium fluoride's high ionic conductivity, electrically insulating properties, high chemical stability, and low solubility in carbonate-based electrolytes. The formation of a lithium fluoride layer along an interface between the negative electrode layer and the porous separator of an electrochemical cell may help prevent direct contact between the negative electrode layer and an electrolyte infiltrating the porous separator, which may help prevent or inhibit the occurrence of undesirable side reactions between the lithium metal of the negative electrode layer and the electrolyte during cycling of the electrochemical cell.

It may be desirable to develop a method that can be used to form lithium fluoride layers at relatively low temperatures directly on components of electrochemical cells prior to assembly of the electrochemical cells.

SUMMARY

This section provides a general summary of the disclosure and is not a comprehensive disclosure of its full scope or all of its features.

The present disclosure relates to a method for manufacturing an interfacial lithium fluoride layer for an electrochemical cell that cycles lithium ions. In step (a), a substrate is positioned in a reaction chamber of an atomic layer deposition reactor. The substrate has functional groups on a major surface thereof. In step (b), a lithium fluoride (LiF) precursor is introduced into the reaction chamber such that the LiF precursor contacts and chemically reacts with the functional groups on the major surface of the substrate. The LiF precursor comprises a lithium- and fluorine-containing acetylacetonate compound. Then, in step (c), an oxidant is introduced into the reaction chamber to form a single molecular layer of lithium fluoride on the major surface of the substrate. Steps (b) and (c) are performed at a temperature of greater than or equal to about 110 degrees Celsius to less than or equal to about 250 degrees Celsius.

The method may further comprise introducing plasma into the reaction chamber.

In some aspects, steps (b) and (c) may be performed at a temperature of less than or equal to about 200 degrees Celsius.

The LiF precursor may have a sublimation temperature of greater than or equal to about 80 degrees Celsius to less than or equal to about 90 degrees Celsius.

The LiF precursor may comprise lithium hexafluoroacetylacetonate.

The oxidant may comprise water, oxygen, ozone, oxygen plasma, ozone plasma, trimethyl phosphate, or a combination thereof.

The LiF precursor and the oxidant may be the only reactants used to form the layer of lithium fluoride.

The substrate may comprise silicon, carbon nanotubes, lithium metal, an electrically insulating polymer, or an electroactive positive electrode material.

The functional groups on the major surface of the substrate may comprise hydroxyl groups.

The method may further comprise purging unreacted LiF precursor compounds and reaction byproducts from the reaction chamber prior to step (c).

The method may further comprise purging unreacted oxidant and reaction byproducts from the reaction chamber after step (c).

At least one of the LiF precursor and the oxidant may be introduced into the reaction chamber along with an inert carrier gas.

A reductant may not be introduced into the reaction chamber before, during, or after steps (b) and (c).

The method may further comprise repeating steps (b) and (c) to form a lithium fluoride layer having a desired thickness on the major surface of the substrate.

The method may further comprise assembling the lithium fluoride layer into an electrochemical cell that cycles lithium ions. In such case, in the electrochemical cell, the lithium fluoride layer may be disposed along an interface between at least one of: (i) a lithium metal negative electrode layer and an adjacent porous separator of the electrochemical cell, and (ii) a positive electrode layer and an adjacent porous separator of the electrochemical cell.

A method for manufacturing an interfacial lithium fluoride layer for an electrochemical cell that cycles lithium ions is disclosed. In step (a), a substrate is positioned in a reaction chamber of an atomic layer deposition reactor. The substrate has functional groups on a major surface thereof. In step (b), a lithium fluoride (LiF) precursor is introduced into the reaction chamber such that the LiF precursor contacts and chemically reacts with the functional groups on the major surface of the substrate. The LiF precursor comprises lithium hexafluoroacetylacetonate. In step (c), an oxidant is introduced into the reaction chamber to form a single molecular layer of lithium fluoride on the major surface of the substrate. The oxidant comprises water, oxygen, ozone, oxygen plasma, ozone plasma, trimethyl phosphate, or a combination thereof. Steps (b) and (c) are repeated to form a lithium fluoride layer having a desired thickness on the major surface of the substrate. Steps (b) and (c) are performed at a temperature of greater than or equal to about 110 degrees Celsius to less than or equal to about 250 degrees Celsius.

Step (c) may further comprise introducing plasma into the reaction chamber.

Steps (b) and (c) may be performed at a temperature of less than or equal to about 200 degrees Celsius.

The LiF precursor and the oxidant may be the only reactants used to form the layer of lithium fluoride.

The substrate may comprise lithium metal, an electrically insulating polymer, or an electroactive positive electrode material.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations and are not intended to limit the scope of the present disclosure.

Corresponding reference numerals indicate corresponding parts throughout the several views of the drawings.

DETAILED DESCRIPTION

Figure 1:
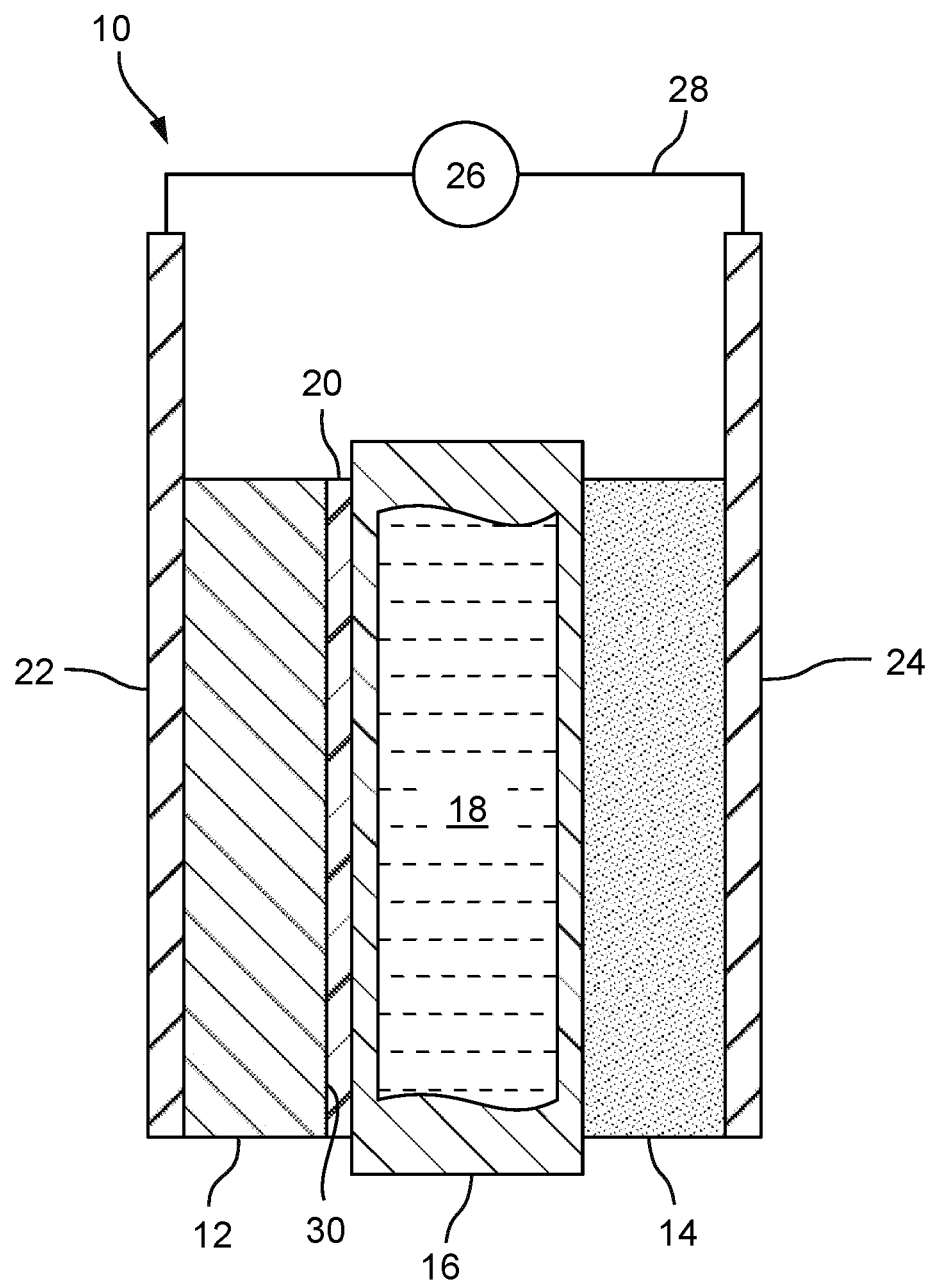
FIG. 1 is a schematic side cross-sectional view of an electrochemical cell including a negative electrode layer, a positive electrode layer, a porous separator, and an interfacial lithium fluoride layer disposed along an interface between the negative electrode layer and the porous separator.

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended terms "comprises," "comprising," "including," and "having," are to be understood as non-restrictive terms used to describe and claim various embodiments set forth herein, in certain aspects, the terms may alternatively be understood to instead be a more limiting and restrictive term, such as "consisting of" or "consisting essentially of." Thus, for any given embodiment reciting compositions, materials, components, elements, ingredients, features, integers, operations, and/or process steps, the present disclosure also specifically includes embodiments consisting of, or consisting essentially of, such recited compositions, materials, components, elements, ingredients, features, integers, operations, and/or process steps. In the case of "consisting of," the alternative embodiment excludes any additional compositions, materials, components, elements, ingredients, features, integers, operations, and/or process steps, while in the case of "consisting essentially of," any additional compositions, materials, components, elements, ingredients, features, integers, operations, and/or process steps that materially affect the basic and novel characteristics are excluded from such an embodiment, but any compositions, materials, components, elements, ingredients, features, integers, operations, and/or process steps that do not materially affect the basic and novel characteristics can be included in the embodiment.

Any method steps, processes, and operations described herein are not to be construed as necessarily requiring their performance in the order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer, or section. Terms such as "first," "second," and other numerical terms when used herein do not imply a sequence or order unless clearly indicated by the context. Thus, a first step, element, component, region, layer, or section discussed below could be termed a second step, element, component, region, layer, or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s), as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges and encompass minor deviations from the given values and embodiments, having about the value mentioned as well as those having exactly the value mentioned. Other than the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

As used herein, the terms "composition" and "material" are used interchangeably to refer broadly to a substance containing at least the preferred chemical constituents, elements, or compounds, but which may also comprise additional elements, compounds, or substances, including trace amounts of impurities, unless otherwise indicated. An "X-based" composition or material broadly refers to compositions or materials in which "X" is the single largest constituent of the composition or material on a weight percentage (%) basis. This may include compositions or materials having, by weight, greater than 50% X, as well as those having, by weight, less than 50% X, so long as X is the single largest constituent of the composition or material based upon its overall weight.

As used herein, the term "metal" may refer to a pure elemental metal or to an alloy of an elemental metal and one or more other metal or nonmetal elements (referred to as "alloying" elements). The alloying elements may be selected to impart certain desirable properties to the alloy that are not exhibited by the base metal element.

Example embodiments will now be described more fully with reference to the accompanying drawings.

The presently disclosed methods may be used to form an ionically conductive and electrically insulating lithium fluoride layers on substrates using a low-temperature (e.g., less than or equal to about 250° C.) atomic layer deposition processes. The low-temperature atomic layer deposition processes may enable the formation of lithium fluoride layers on one or more components of an electrochemical cell prior to assembly of the electrochemical cell. For example, the presently disclosed atomic layer deposition process may be used to form a lithium fluoride layer on a lithium metal substrate that may be subsequently used as a negative electrode layer in an electrochemical cell that cycle lithium ions. In such case, in assembly, the lithium fluoride layer may be disposed along an interface between the negative electrode layer and an adjacent porous separator of the electrochemical cell. As another example, the presently disclosed atomic layer deposition process may be used to form a lithium fluoride layer on a porous polymeric membrane that may be subsequently used as a porous separator layer in an electrochemical cell that cycle lithium ions. In such case, in assembly, the lithium fluoride layer may be disposed along an interface between the porous separator layer and a negative electrode layer of the electrochemical cell. In yet another example, the presently disclosed atomic layer deposition process may be used to form a lithium fluoride layer on an electroactive positive electrode material that may be subsequently used as a positive electrode layer in an electrochemical cell that cycle lithium ions. In such case, in assembly, the lithium fluoride layer may be disposed along an interface between the positive electrode layer and the porous separator layer of the electrochemical cell. Formation of the interfacial lithium fluoride layers is performed prior to assembly of the electrochemical cells and thus does not result in decomposition of the electrolyte or consumption of active lithium metal.

FIG. 1 depicts a schematic side cross-sectional view of an electrochemical cell 10 that cycles lithium ions. The electrochemical cell 10 may be combined with one or more additional electrochemical cells to form a secondary lithium battery, such as a lithium metal battery (not shown). The electrochemical cell 10 comprises a negative electrode layer 12, a positive electrode layer 14, a porous separator 16, an electrolyte 18, and an interfacial lithium fluoride layer 20 disposed along an interface between the negative electrode layer 12 and the porous separator 16. The negative electrode layer 12 is disposed on a major surface of a negative electrode current collector 22 and the positive electrode layer 14 is disposed on a major surface of a positive electrode current collector 24. In practice, the negative and positive electrode current collectors 22, 24 may be electrically coupled to a power source or load 26 via an external circuit 28.

The negative electrode layer 12 is electrochemically active and may be disposed directly or indirectly on the major surface of the negative electrode current collector 22. The negative electrode layer 12 may comprise a layer of lithium metal and may consist essentially of lithium (Li) metal. For example, the negative electrode layer 12 may comprise, by weight, greater than 97% lithium or, more preferably, greater than 99% lithium. The negative electrode layer 12 may be substantially free of elements or compounds that undergo a reversible redox reaction with lithium during operation of the electrochemical cell 10. For example, the negative electrode layer 12 may be substantially free of an intercalation host material that is formulated to undergo the reversible insertion or intercalation of lithium ions or an alloying material that can electrochemically alloy and form compound phases with lithium. In addition, the negative electrode layer 12 may be substantially free of a conversion material or an alloy material that can electrochemically alloy and form compound phases with lithium. Some examples of materials that may be intentionally excluded from the negative electrode layer 12 include carbon-based materials (e.g., graphite, activated carbon, carbon black, and graphene), silicon and silicon-based materials, tin oxide, aluminum, indium, zinc, cadmium, lead, germanium, tin, antimony, titanium oxide, lithium titanium oxide, lithium titanate, lithium oxide, metal oxides (e.g., iron oxide, cobalt oxide, manganese oxide, copper oxide, nickel oxide, chromium oxide, ruthenium oxide, and/or molybdenum oxide), metal phosphides, metal sulfides, and metal nitrides (e.g., phosphides, sulfides, and/or nitrides or iron, manganese, nickel, copper, and/or cobalt). The negative electrode layer 12 may be substantially free of a polymeric binder. Some examples of polymeric binders that may be intentionally excluded from negative electrode layer 12 include polyvinylidene fluoride (PVdF), ethylene propylene diene monomer (EPDM) rubber, styrene butadiene rubber (SBR), carboxymethyl cellulose (CMC), and polyacrylic acid. The negative electrode layer 12 may have a thickness in a range of greater than zero micrometers and less than or equal to 100 micrometers, depending upon the state of charge of the electrochemical cell 10.

The positive electrode layer 14 is porous and is physically spaced apart from the negative electrode layer 12 and the lithium fluoride layer 20 by the porous separator 16. The positive electrode layer 14 may comprise one or more electrochemically active materials that can undergo a reversible redox reaction with lithium, e.g., a material that can sufficiently undergo lithium intercalation and deintercalation, alloying and dealloying, or plating and stripping. In one form, the positive electrode layer 14 may comprise an intercalation host material that can undergo the reversible insertion or intercalation of lithium ions. In such case, the intercalation host material of the positive electrode layer 14 may comprise a layered oxide represented by the formula $LiMeO_2$, an olivine-type oxide represented by the formula $LiMePO_4$, a spinel-type oxide represented by the formula $LiMe_2O_4$, a tavorite represented by one or both of the following formulas $LiMeSO_4F$ or $LiMePO_4F$, or a combination thereof, where Me is a transition metal (e.g., Co, Ni, Mn, Fe, Al, V, or a combination thereof). In another form, the positive electrode layer 14 may comprise a conversion material including a component that can undergo a reversible electrochemical reaction with lithium, in which the component undergoes a phase change or a change in crystalline structure accompanied by a change in oxidation state. In such case, the conversion material of the positive electrode layer 14 may comprise sulfur, selenium, tellurium, iodine, a halide (e.g., a fluoride or chloride), sulfide, selenide, telluride, iodide, phosphide, nitride, oxide, oxysulfide, oxyfluoride, sulfur-fluoride, sulfur-oxyfluoride, or a lithium and/or metal compound thereof. Examples of suitable metals for inclusion in the conversion material of the positive electrode layer 14 include iron, manganese, nickel, copper, and cobalt. The electrochemically active material of the positive electrode layer 14 may be intermingled with a polymeric binder to provide the positive electrode layer 14 with structural integrity. Examples of polymeric binders include polyvinylidene fluoride (PVdF), ethylene propylene diene monomer (EPDM) rubber, styrene butadiene rubber (SBR), carboxymethyl cellulose (CMC), polyacrylic acid, and mixtures thereof. The positive electrode layer 14 optionally may include particles of an electrically conductive material, which may comprise very fine particles of, for example, high-surface area carbon black.

The porous separator 16 physically and electrically isolates the negative and positive electrode layers 12, 14 from each other while permitting lithium ions to pass therethrough. The porous separator 16 exhibits an open microporous structure and may comprise an organic and/or inorganic material. The porous separator 16 may comprise a nonwoven material, e.g., a manufactured sheet, membrane, film, web, or mat of directionally or randomly oriented fibers. The porous separator 16 may comprise a polymer or a combination of polymers. For example, the porous separator 16 may comprise one or more polyolefins, e.g., polyethylene (PE), polypropylene (PP), polyamide (PA), poly(tetrafluoroethylene) (PTFE), polyvinylidene fluoride (PVdF), and/or poly(vinyl chloride) (PVC). In one form, the porous separator 16 may comprise a laminate of polymers, e.g., a laminate of PE and PP. In some aspects, the porous separator 16 may comprise a ceramic coating (not shown) disposed on one or both sides thereof. The ceramic coating may comprise particles of alumina ($Al_2O_3$) and/or silica ($SiO_2$). When present, the ceramic coating may have a thickness in a range of 1 micrometer to 20 micrometers.

The electrolyte 18 is ionically conductive and provides a medium for the conduction of lithium ions between the negative electrode layer 12 and the positive electrode layer 14. In assembly, the electrochemical cell 10 may be infiltrated with the electrolyte 18 and the positive electrode layer 14, the porous separator 16, and the lithium fluoride layer 20 may be in direct physical contact with the electrolyte 18. The electrolyte 18 may be in the form of a nonaqueous liquid electrolyte, a gel electrolyte, or a solid electrolyte. When the electrolyte 18 is in the form of a liquid, the electrolyte 18 may comprise a nonaqueous liquid electrolyte solution comprising a lithium salt dissolved or ionized in a nonaqueous, aprotic organic solvent or a mixture of nonaqueous, aprotic organic solvents. Examples of lithium salts include $LiClO_4$, $LiAlCl_4$, LiI, LiBr, LiSCN, $LiBF_4$, $LiB(C_6H_5)_4$, $LiAsF_6$, $LiCF_3SO_3$, $LiN(CF_3SO_2)_2$, $Li_2CO_3$, $LiPF_6$, and combinations thereof. Examples of nonaqueous, aprotic organic solvents include cyclic carbonates (i.e., ethylene carbonate, propylene carbonate), acyclic carbonates (i.e., dimethyl carbonate, diethyl carbonate, ethyl methyl carbonate), aliphatic carboxylic esters (i.e., methyl formate, methyl acetate, methyl propionate), γ-lactones (i.e., γ-butyrolactone, γ-valerolactone), acyclic ethers (i.e., 1,2-dimethoxyethane, 1,2-diethoxyethane, ethoxymethoxyethane), and/or cyclic ethers (i.e., tetrahydrofuran, 2-methyltetrahydrofuran). When the electrolyte 18 is in the form of a gel or plasticized polymer electrolyte, the electrolyte 18 may comprise a polymer host material soaked with a nonaqueous liquid electrolyte solution. Examples of polymer host materials include poly(vinylidene) (PVdF), poly(acrylonitrile) (PAN), poly(methyl methacrylate) (PMMA), poly(ethylene oxide) (PEO), polyacrylates, and poly(vinylidene fluoride-hexafluoropropylene) (PVdF-HFP).

The negative and positive electrode current collectors 22, 24 may be in the form of thin and flexible porous or non-porous electrically conductive metal substrates. In aspects, the negative electrode current collector 22 may comprise copper (Cu), nickel (Ni), an iron (Fe) alloy (e.g., stainless steel), or titanium (Ti). Other electrically conductive metals may of course be used, if desired.

The lithium fluoride layer 20 is configured to form an electrically insulating and ionically conductive interface along a major facing surface 30 of the negative electrode layer 12. In assembly, the lithium fluoride layer 20 may be physically sandwiched between the negative electrode layer 12 and the porous separator 16. Without intending to be bound by theory, it is believed that, in practice, the lithium fluoride layer 20 may help prevent direct contact between the negative electrode layer 12 and the electrolyte 18 during cycling of the electrochemical cell 10. The lithium fluoride layer 20 may be formed directly on the major facing surface 30 of the negative electrode layer 30 or on an opposing surface of the porous separator 16. Without intending to be bound by theory, it is believed that formation of the lithium fluoride layer 20 between the negative electrode layer 12 and the electrolyte 18 may improve the coulombic efficiency and cycling stability there of the electrochemical cell 10, for example, by promoting the uniform plating and stripping of Li+ ions on the negative electrode current collector 22 and inhibiting undesirable parasitic side reactions between the negative electrode layer 12 and the electrolyte 18. The lithium fluoride layer 20 may comprise, consist essentially of, or consist of compounds of lithium fluoride (LiF). The lithium fluoride layer 20 may exhibit a thickness in the range of 10 nanometers to 5 micrometers. The lithium fluoride layer 20 is substantially nonporous and may have a porosity of less than or equal to about 5% or about 1%.

Although not shown in the drawings, in some aspects, the presently disclosed methods may be used to form a lithium fluoride layer directly on a major facing surface of the positive electrode layer 14 or on an opposing surface of the porous separator 16.

Figure 2:
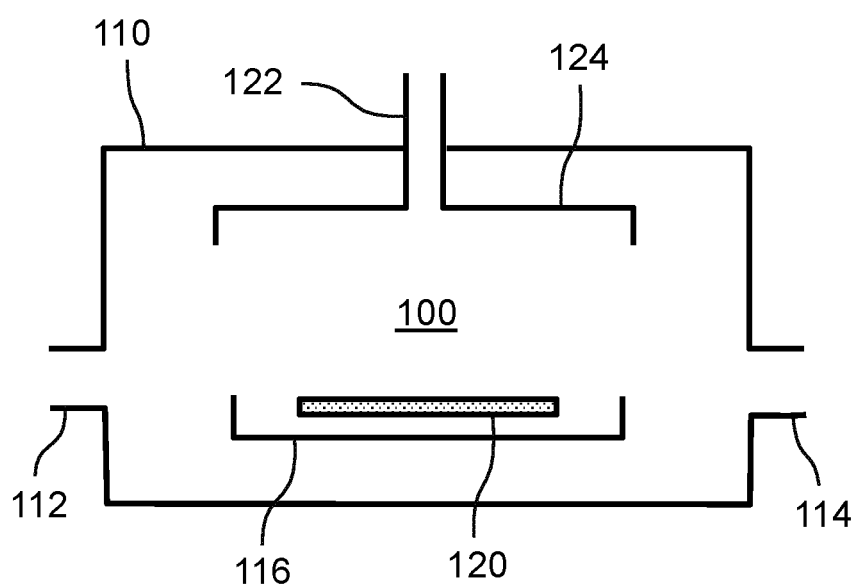
FIG. 2 is a schematic cross-sectional view of an atomic layer deposition reactor for manufacturing the interfacial lithium fluoride layer of FIG. 1.

The lithium fluoride layer 20 may be formed on the negative electrode layer 30, on the porous separator 16, or on the positive electrode layer 14 via an atomic layer deposition process, e.g., a plasma enhanced atomic layer deposition process. Referring now to FIG. 2, the atomic layer deposition process may be carried out in a reaction chamber 100 of an atomic layer deposition reactor 110. The reactor 110 may include an inlet 112 and an outlet 114 in fluid communication with the reaction chamber 100, and a platform 116 disposed within the reaction chamber 100 and configured to hold a substrate 120 during the atomic layer deposition process. The platform 116 may be heated. In aspects a plasma enhanced atomic layer deposition process is employed, the reactor 110 may include a plasma gas inlet 122 and a showerhead 124, which may be used as an electrode for the introduction of electromagnetic energy, e.g., radio frequency (RF) energy, into the reaction chamber 100 to create the plasma.

In a first step of the process, the substrate 120 may be positioned within the reaction chamber 100 of the atomic layer deposition reactor 110, for example, on the platform 116. The substrate 120 may have a plurality of functional groups on a major surface thereof, or the major surface of the substrate 120 may be modified to include a plurality of functional groups. Examples of functional groups include hydroxyl (—OH) groups. The substrate 120 may comprise an inert substrate (e.g., a silicon wafer) or a material that can be subsequently used as a component of the electrochemical cell 10. For example, the substrate 120 may comprise a layer of material having substantially the same composition as that of the porous separator 16, the negative electrode layer 12, or the positive electrode layer 14.

After the substrate 120 is positioned in the reaction chamber 100, a lithium fluoride (LiF) precursor is heated to transform the LiF precursor into a vapor. Vapors of the LiF precursor are introduced into the reaction chamber 100, e.g., via the inlet 112, such that the LiF precursor contacts and chemically reacts with the functional groups on the major surface of the substrate 120 to form a single molecular layer of an intermediate species on the major surface of the substrate 120. The LiF precursor may have a sublimation temperature of greater than or equal to about 80 degrees Celsius (° C.) to less than or equal to about 90° C. As such, the LiF precursor may be heated to a temperature greater than or equal to about 80° C. to transform the LiF precursor into a vapor.

In the reaction chamber 100, the LiF precursor may be heated to a temperature of greater than or equal to about 110 degrees Celsius to less than or equal to about 250 degrees Celsius, less than or equal to about 200 degrees Celsius, less than or equal to about 150° C., less than or equal to about 140° C., or less than or equal to about 110° C. In aspects, the LiF precursor may be heated in the reaction chamber 100 to a temperature in a range of about 25° C. to about 50° C. greater than the sublimation temperature of the LiF precursor. For example, the LiF precursor may be heated to a temperature greater than or equal to about 110° C. to less than or equal to about 135° C. The LiF precursor may be introduced into the reaction chamber 100 along with an inert carrier gas, e.g., argon and/or nitrogen. The reaction chamber 100 may be maintained at a pressure of greater than or equal to about 100 millitorr and less than or equal to about 1 torr when the LiF precursor is introduced into the reaction chamber 100.

The LiF precursor comprises a lithium- and fluorine-containing chemical compound. The LiF precursor is formulated to be the only source of lithium and fluorine atoms in the lithium fluoride layer 20. The LiF precursor may comprise a lithium- and fluorine-containing acetylacetonate (acac) compound. For example, the LiF precursor may comprise lithium hexafluoroacetylacetone Li(hfac).

After the vapors of the LiF precursor chemically react with the functional groups on the substrate 120 to form the intermediate species, unreacted LiF precursor compounds and reaction byproducts may be purged from the reaction chamber 100, for example, by evacuating gaseous species from the reaction chamber 100 under vacuum. In aspects, the LiF precursor may be introduced into the reaction chamber 100 for a precursor pulse duration of greater than or equal to about 100 milliseconds to less than or equal to about 5 seconds and then the unreacted LiF precursor compounds and reaction byproducts may be purged from the reaction chamber 100 for a purge duration of greater than or equal to about 15 seconds to less than or equal to about 120 seconds.

After the unreacted LiF precursor compounds and reaction byproducts are purged from the reaction chamber 100, an oxidant may be introduced into the reaction chamber 100 to transform the intermediate species into a single molecular layer of lithium fluoride on the major surface of the substrate 120. The oxidant may react with the intermediate species on the major surface of the substrate 120 to form carbon (C)- and hydrogen (H)-containing species (e.g., $CO_2$ and/or $H_2O$) and thereby remove C and H atoms from the intermediate species, leaving behind lithium- and fluorine-containing compounds (lithium fluoride). The oxidant comprises an oxygen (O) containing species. For example, the oxidant may comprise water ($H_2O$), oxygen ($O_2$), ozone ($O_3$), $O_2$ plasma, $O_3$ plasma, trimethyl phosphate (TMP), or a combination thereof. The oxidant may be introduced into the reaction chamber 100 along with an inert carrier gas, e.g., argon and/or nitrogen. The reaction chamber 100 may be maintained at a pressure of greater than or equal to about 100 millitorr and less than or equal to about 1 torr when the oxidant is introduced into the reaction chamber 100.

The lithium fluoride layer formed on the major surface of the substrate 120 may comprise, consist essentially of, or consist of lithium fluoride. For example, the lithium fluoride layer may comprise, on an atomic basis, greater than or equal to about 20% to less than or equal to about 80% lithium, greater than or equal to about 20% to less than or equal to about 80% fluorine, and less than or equal to about 5% oxygen, carbon, and/or hydrogen.

In aspects, plasma may be introduced into the reaction chamber 100 along with the oxidant or at substantially the same time as the oxidant. In such case, when the oxidant is exposed to the plasma in the reaction chamber 100, the oxidant may undergo electron-molecule collisions, producing high energy excited oxidant molecules and molecular fragments that readily react with the intermediate species on the major surface of the substrate 120.

The lithium and fluorine atoms in the LiF precursor may be incorporated into the lithium fluoride layer formed on the major surface of the substrate 120. The lithium and fluorine atoms in the LiF precursor may be the single source of lithium and fluorine in the lithium fluoride layer formed on the major surface of the substrate 120. In addition, the LiF precursor and the oxidant may be the only reactants used in the atomic layer deposition process to form the lithium fluoride layer on the major surface of the substrate 120. For example, a single molecular layer of lithium fluoride may be formed on the major surface of the substrate 120 without introducing a reductant (e.g., molecular hydrogen and/or formalin) into the reaction chamber 100 before or after the LiF precursor and the oxidant are introduced into the reaction chamber 100. Without intending to be bound by theory, it is believed that, because the LiF precursor and the oxidant may be the only reactants used to form the lithium fluoride layer, the resulting lithium fluoride layer is substantially free of contaminants, unreacted LiF precursor compounds, unreacted oxidants, and undesirable reaction byproducts.

After formation of the single molecular layer of lithium fluoride on the major surface of the substrate 120, unreacted oxidant and reaction byproducts may be purged from the reaction chamber 100, for example, by evacuating gaseous species from the reaction chamber 100 under vacuum. In aspects, the oxidant may be introduced into the reaction chamber 100 for an oxidant pulse duration of greater than or equal to about 100 milliseconds to less than or equal to about 5 seconds and then the unreacted oxidant and reaction byproducts may be purged from the reaction chamber 100 for a purge duration of greater than or equal to about 15 seconds to less than or equal to about 120 seconds Each four-step cycle of the atomic layer deposition process (1—LiF precursor pulse, 2—gas purge, 3—oxidant pulse, and 4—gas purge) results in the formation of a single molecular layer of lithium fluoride on the major surface of the substrate 120. As such, the four-step cycle of the atomic layer deposition process may be repeated multiple times to build-up a layer of lithium fluoride on the substrate 120 that exhibits a desired thickness. For example, it may be desirable to form a lithium fluoride layer on the major surface of the substrate 120 having a thickness of greater than or equal to about 10 nanometers to less than or equal to about 1 micrometer. In such case, the four-step cycle of the atomic layer deposition process may be repeated at least 200 times, for example, about greater than or equal to about 200 times to less than or equal to about 2000 times to form a lithium fluoride layer on the major surface of the substrate 120 having a desired thickness.

The foregoing description of the embodiments has been provided for purposes of illustration and description. It is not intended to be exhaustive or to limit the disclosure. Individual elements or features of a particular embodiment are generally not limited to that embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for manufacturing an interfacial lithium fluoride layer for an electrochemical cell that cycles lithium ions, the method comprising:
   (a) positioning a substrate in a reaction chamber of an atomic layer deposition reactor, the substrate having functional groups on a major surface thereof;
   (b) introducing a lithium fluoride (LiF) precursor into the reaction chamber such that the LiF precursor contacts and chemically reacts with the functional groups on the major surface of the substrate, the LiF precursor comprising a lithium- and fluorine-containing acetylacetonate compound; and
   (c) after step (b), introducing an oxidant into the reaction chamber to form a single molecular layer of lithium fluoride on the major surface of the substrate,
   wherein steps (b) and (c) are performed at a temperature of greater than or equal to about 110 degrees Celsius to less than or equal to about 250 degrees Celsius.

2. The method of claim 1, wherein step (c) further comprises:
   introducing plasma into the reaction chamber.

3. The method of claim 1, wherein steps (b) and (c) are performed at a temperature of less than or equal to about 200 degrees Celsius.

4. The method of claim 1, wherein the LiF precursor has a sublimation temperature of greater than or equal to about 80 degrees Celsius to less than or equal to about 90 degrees Celsius.

5. The method of claim 1, wherein the LiF precursor comprises lithium hexafluoroacetylacetonate.

6. The method of claim 1, wherein the oxidant comprises water, oxygen, ozone, oxygen plasma, ozone plasma, trimethyl phosphate, or a combination thereof.

7. The method of claim 1, wherein the LiF precursor and the oxidant are the only reactants used to form the layer of lithium fluoride.

8. The method of claim 1, wherein the substrate comprises silicon, carbon nanotubes, lithium metal, an electrically insulating polymer, or an electroactive positive electrode material.

9. The method of claim 8, wherein the functional groups on the major surface of the substrate comprise hydroxyl groups.

10. The method of claim 1, further comprising:
    purging unreacted LiF precursor compounds and reaction byproducts from the reaction chamber prior to step (c).

11. The method of claim 10, further comprising:
    purging unreacted oxidant and reaction byproducts from the reaction chamber after step (c).

12. The method of claim 1, wherein at least one of the LiF precursor or the oxidant are introduced into the reaction chamber along with an inert carrier gas.

13. The method of claim 1, wherein a reductant is not introduced into the reaction chamber before, during, or after steps (b) and (c).

14. A method for manufacturing an interfacial lithium fluoride layer for an electrochemical cell that cycles lithium ions, the method comprising:
    (a) positioning a substrate in a reaction chamber of an atomic layer deposition reactor, the substrate having functional groups on a major surface thereof;
    (b) introducing a lithium fluoride (LiF) precursor into the reaction chamber such that the LiF precursor contacts and chemically reacts with the functional groups on the major surface of the substrate, the LiF precursor comprising lithium hexafluoroacetylacetonate; and
    (c) after step (b), introducing an oxidant into the reaction chamber to form a single molecular layer of lithium fluoride on the major surface of the substrate, the oxidant comprising water, oxygen, ozone, oxygen plasma, ozone plasma, trimethyl phosphate, or a combination thereof,
    wherein steps (b) and (c) are performed at a temperature of greater than or equal to about 110 degrees Celsius to less than or equal to about 250 degrees Celsius.

15. The method of claim 14, wherein step (c) further comprises:
    introducing plasma into the reaction chamber.

16. The method of claim 14, wherein steps (b) and (c) are performed at a temperature of less than or equal to about 200 degrees Celsius.

17. The method of claim 14, wherein the LiF precursor and the oxidant are the only reactants used to form the layer of lithium fluoride.

18. The method of claim 14, wherein the substrate comprises lithium metal, an electrically insulating polymer, or an electroactive positive electrode material.

* * * * *